US011458512B2

(12) United States Patent
Butterbaugh

(10) Patent No.: US 11,458,512 B2
(45) Date of Patent: Oct. 4, 2022

(54) SYSTEMS AND METHODS FOR ROTATING AND TRANSLATING A SUBSTRATE IN A PROCESS CHAMBER

(71) Applicant: TEL Manufacturing and Engineering of America, Inc., Chaska, MN (US)

(72) Inventor: Jeffery W. Butterbaugh, Eden Prairie, MN (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 11 days.

(21) Appl. No.: 17/070,223

(22) Filed: Oct. 14, 2020

(65) Prior Publication Data

US 2021/0023591 A1 Jan. 28, 2021

Related U.S. Application Data

(62) Division of application No. 15/881,447, filed on Jan. 26, 2018, now Pat. No. 10,843,236.

(Continued)

(51) Int. Cl.

*B08B 3/10* (2006.01)
*H01L 21/67* (2006.01)

(Continued)

(52) U.S. Cl.

CPC ................ *B08B 3/10* (2013.01); *B08B 3/024* (2013.01); *B08B 3/041* (2013.01); *B08B 3/08* (2013.01); *B08B 11/02* (2013.01); *H01L 21/02101* (2013.01); *H01L 21/6719* (2013.01); *H01L 21/67051* (2013.01); *H01L 21/68764* (2013.01);

(Continued)

(58) Field of Classification Search

CPC ......... B08B 15/00; B08B 3/02; B08B 17/025; B08B 2230/01; B60S 3/04; C02F 9/00; C02F 1/001; C02F 1/32; C02F 2103/44; C02F 2201/007; C02F 2301/046; C02F 1/38; C02F 1/56

See application file for complete search history.

(56) References Cited

U.S. PATENT DOCUMENTS 3,538,883 A 11/1970 Polin
5,270,600 A 12/1993 Hashimoto (Continued)

FOREIGN PATENT DOCUMENTS

CN 105314343 A 2/2016
JP 1987173718 A 7/1987

(Continued)

OTHER PUBLICATIONS

JP 2019-530478, English Translation of Notice of Reason(s) for Rejection, dated Nov. 30, 2021, pp. 1-6.

(Continued)

*Primary Examiner* — Benjamin L Osterhout
(74) *Attorney, Agent, or Firm* — Kagan Binder, PLLC

(57) ABSTRACT

Disclosed herein are systems and methods related to a handling system used to move a semiconductor substrate within a process chamber during treatment. The handling system moves the substrate back-and-forth between two locations in an arc-like motion around a pivot point, while simultaneously rotating the substrate around its own center point.

6 Claims, 6 Drawing Sheets

Related U.S. Application Data

(60) Provisional application No. 62/451,499, filed on Jan. 27, 2017.

(51) Int. Cl.
*H01L 21/687* (2006.01)
*B08B 3/08* (2006.01)
*H01L 21/02* (2006.01)
*B08B 3/04* (2006.01)
*H02N 15/00* (2006.01)
*B08B 11/02* (2006.01)
*B08B 3/02* (2006.01)

(52) U.S. Cl.
CPC ....... *H01L 21/68785* (2013.01); *H02N 15/00* (2013.01)

(56) References Cited

U.S. PATENT DOCUMENTS 5,554,964 A 9/1996 Jansseune
5,598,974 A 2/1997 Lewis et al.
5,730,803 A 3/1998 Steger et al.
5,818,137 A 10/1998 Nichols
5,820,104 A 10/1998 Koyano et al.
5,887,605 A 3/1999 Lee et al.
5,961,732 A 10/1999 Patrin et al.
5,965,047 A 10/1999 Blersch et al.
6,136,163 A 10/2000 Cheung et al.
6,146,463 A 11/2000 Yudovsky et al.
6,168,665 B1 1/2001 Sakai et al.
6,217,423 B1 4/2001 Ohmori et al.
6,241,577 B1 6/2001 Shibata
6,290,569 B1 9/2001 Mizuno et al.
6,435,798 B1 8/2002 Satoh
6,800,833 B2 10/2004 Gregor et al.
7,332,691 B2 2/2008 Choi et al.
7,860,379 B2 12/2010 Hunter et al.
8,314,371 B2 11/2012 Sorabji
8,844,546 B2 9/2014 Chen et al.
9,564,378 B2 2/2017 Rose et al.
9,689,507 B2 6/2017 Taguchi
9,837,260 B2 12/2017 Inai et al.
10,012,316 B2 7/2018 Taguchi et al.
10,418,270 B2 9/2019 Hanzlik et al.
10,468,277 B2 11/2019 Schoeb
10,843,236 B2 11/2020 Butterbaugh
10,910,253 B2 2/2021 Inhofer et al.
10,991,610 B2 4/2021 Butterbaugh et al.
11,020,774 B2 6/2021 Mbanaso
11,035,488 B2 6/2021 Kozaki
11,268,630 B2 3/2022 Hosek
2002/0017237 A1 2/2002 Wirth et al.
2002/0157686 A1 10/2002 Kenny et al.
2003/0015141 A1 1/2003 Takagi
2003/0132746 A1 7/2003 Cox
2003/0156270 A1 8/2003 Hunter
2003/0178145 A1 9/2003 Anderson et al.
2003/0230323 A1 12/2003 You et al.
2004/0004713 A1 1/2004 Go et al.
2004/0005212 A1 1/2004 Wu
2004/0163670 A1 8/2004 Ko et al.
2004/0221877 A1 11/2004 Bergman
2005/0031497 A1 2/2005 Siebert et al.
2005/0127927 A1 6/2005 Harris et al.
2006/0039781 A1 2/2006 Niewmierzycki et al.
2006/0162739 A1 7/2006 Sogard
2006/0182528 A1 8/2006 Fan et al.
2007/0209684 A1 9/2007 Chen et al.
2007/0247778 A1 10/2007 Harb et al.
2008/0056857 A1 3/2008 Hiroki
2008/0099090 A1 5/2008 Cook
2008/0229811 A1 9/2008 Zhao et al.
2008/0280453 A1 11/2008 Koelmel et al.
2009/0114253 A1 5/2009 Matsumoto
2009/0314211 A1 12/2009 Du Bois et al.
2010/0012856 A1 1/2010 Aoki
2010/0048106 A1* 2/2010 Wang ...................... B24B 37/04 451/60
2011/0188974 A1 8/2011 Diamond
2012/0325275 A1 12/2012 Goodman et al.
2013/0062839 A1 3/2013 Tschiderle et al.
2013/0152971 A1 6/2013 Kato
2013/0214497 A1 8/2013 Yoshida
2013/0233356 A1 9/2013 Obweger et al.
2014/0152976 A1 6/2014 VanHoomissen et al.
2014/0166055 A1 6/2014 Haung et al.
2014/0332161 A1 11/2014 Ricci et al.
2015/0052702 A1 2/2015 Dobashi et al.
2015/0187629 A1 7/2015 Obweger et al.
2015/0279708 A1 10/2015 Kobayashi et al.
2016/0064213 A1 3/2016 Sakai et al.
2016/0096207 A1 4/2016 Butterbaugh et al.
2016/0172256 A1 6/2016 Rose et al.
2016/0303617 A1* 10/2016 Mbanaso .......... H01L 21/02043
2017/0338131 A1 11/2017 Amahisa et al.
2017/0341093 A1* 11/2017 Hanzlik .................. B05B 1/005
2018/0025904 A1* 1/2018 DeKraker ......... H01L 21/67051 134/21
2018/0130694 A1 5/2018 Inhofer et al.
2018/0151396 A1 5/2018 Hanzlik et al.
2018/0158717 A1 6/2018 Hanzlik et al.
2018/0214915 A1 8/2018 Butterbaugh
2019/0255580 A1 8/2019 Mbanaso
2020/0020566 A1 1/2020 Inhofer et al.
2022/0102188 A1 3/2022 Tang

FOREIGN PATENT DOCUMENTS

JP 1993023542 U 3/1993
JP 2001079505 A 3/2001
JP 2002086048 A 3/2002
JP 2003017547 A 1/2003
JP 2003179040 A 6/2003
JP 2005098163 A 4/2005
JP 2005225621 A 8/2005
JP 2006005177 A 1/2006
JP 2007123790 A 5/2007
JP 2008182228 A 8/2008
JP 2008252007 A 10/2008
JP 2010514167 A 4/2010
JP 2011-216888 A 10/2011
JP 2012-21275 A 11/2012
JP 2014049605 A 3/2014
JP 2015041646 A 3/2015
JP 2016-076702 A 5/2016
JP 2016076702 A 5/2016
KR 100187445 B1 4/1999
KR 20110036915 A 4/2011
KR 2016-0041021 A 4/2016
WO 2008077048 A3 6/2008
WO 2010054076 A2 5/2010
WO 2014170928 A 10/2014
WO 2016/057524 A1 4/2016

OTHER PUBLICATIONS

JP 2019-540660, English Translation of Notice of Reason(s) for Rejection, dated Nov. 9, 2021, pp. 1-6.
JP 2019-528673, English Translation of Notice of Reason(s) for Rejection, dated Dec. 14, 2021, pp. 1-7.
PCT/US2017/0695166, PCT International Search Report, dated Mar. 29, 2018, 3 pgs.
PCT/US2014/069557, PCT International Search Report, dated Mar. 3, 2015, 5 pgs.
PCT/US2017/063486, PCT International Search Report, dated Mar. 5, 2018, 3 pgs.
PCT/US2017060543, PCT International Search Report, dated Feb. 20, 2018, 5 pgs.
PCT/US2018/015545, PCT International Search Report, dated May 14, 2018, 4 pgs.

(56) References Cited

OTHER PUBLICATIONS

PCT/US2019/018405 PCT International Search Report, dated May 6, 2019, 2018, 3 pgs.
Japanese Patent Application No. 2019-524030, Office Action dated Oct. 14, 2021, non-English and translated, pp. 1-16.
Japanese Patent Application No. 2019-524030, Office Action dated May 10, 2022, non-English and translated, pp. 1-16.
Korean Patent Application No. 10-2019-7019429, Office Action dated May 29, 2022, non-English and translated, pp. 1-12.
Korean Patent Application No. 10-2019-7025028, Office Action dated May 10, 2022, non-English and translated, pp. 1-16.
Korean Patent Application No. 10-2019-7016273, Office Action dated May 13, 2022, non-English and translated, pp. 1-17.

* cited by examiner

SYSTEMS AND METHODS FOR ROTATING AND TRANSLATING A SUBSTRATE IN A PROCESS CHAMBER

CROSS REFERENCE TO RELATED APPLICATIONS

Background

This nonprovisional patent application is a divisional application of U.S. Ser. No. 15/881,447, filed Jan. 26, 2018, which claims priority to the U.S. Provisional Application No. 62/451,499 filed on Jan. 27, 2017, entitled "Systems and Methods for Rotating and Translating a Substrate in a Process Chamber" the contents of which are incorporated herein by reference in their respective entireties for all purposes.

BACKGROUND

IC manufacturing may be carried out by the application and selective removal of various materials on the microelectronic substrate. One aspect of the manufacturing process may include exposing the surface of the microelectronic substrate to cleaning treatments to remove process residue and/or debris (e.g., particles) from the microelectronic substrate. Various dry and wet cleaning techniques have been developed to clean microelectronic substrates to improve production yields and device performance. However, the increasing density of active components (e.g., smaller device features) has made the devices more susceptible to physical damage from kinetic cleaning treatments and yield loss from smaller particles than in the past. Hence, enabling the removal of smaller particles, and/or relatively larger particles, without damaging sensitive structures on the substrate, would be desirable.

In the past, typical hardware configurations for cryogenic cleaning equipment have used spray bars or nozzles to dispense cleaning chemistries to the substrate. In some previous approaches, substrates were translated under the spray bars or nozzles to maximize treatment coverage to uniformly clear the substrate in an efficient manner. This approach led to designing process chambers with interior volumes capable translating the entire substrate under a localized process spray or jet, such that the process spray would pass across the entire diameter of the substrate at a minimum dwell time to achieve a desired particle removal efficiency (PRE). For example, the process chamber included a linear slide table with sliding or stabilizing rods to move the carrying linear slide table through the spray, so that the entire substrate would pass through the spray. The rods had spring energized seals which were susceptible to seal leakage and causing particle and process problems. The rod's friction surface areas were a potential particle source that required lubrication, which introduced additional contamination and particle issues. In these embodiments, process chambers were longer than twice the diameter of the substrate to achieve desired PRE results. However, the size of linear translation components (e.g., rods) required a chamber volume much larger than the substrate and increased the friction surface area within the process chamber as the size of substrate diameters increased. Additionally, the larger chamber volumes increased cost (e.g., longer pump down time, more chemicals, and larger footprint) without a corresponding increase in process performance.

Hence, any improvements to process chamber design which maximize surface treatment coverage, improve particle removal efficiency, reduce process cycle time, decrease chemical cost, and/or decrease equipment cost would be desirable.

SUMMARY

Described herein are embodiments for systems and methods for handling a substrate within a process chamber to eliminate the need for linear translation rods with sliding seals and to minimize the overall movement footprint while treating the entire substrate. The movement footprint being the maximum amount of two-dimensional area covered by the substrate's movement during processing. Minimizing the movement footprint is accomplished by a substrate handling mechanism that does not require linear translation of the substrate. Broadly, the handling mechanism integrates two simultaneous radial movements of the substrate to minimize the 2-D movement, while adequately exposing the substrate to the cleaning chemistry to achieve a desirable PRE. The centers of rotation for the handling mechanism are located at opposite ends of a swing-arm. The first end of the swing-arm includes a pivot point (e.g., $1^{st}$ center of rotation) and the opposite end of the swing-arm includes a substrate holder to secure the substrate to the swing-arm. The substrate holder includes a rotation mechanism (e.g., $2^{nd}$ center of rotation) that enables the substrate to rotate around its own center point. The substrate handling system is designed to position the front-side of a substrate underneath a chemical dispense point, rotate the substrate around its own center point, while simultaneously moving the rotating substrate in an arc-like motion around the pivot point.

The system described herein may provide several advantages over linear motion systems used in previous approaches. For instance, minimizing the horizontal movement may enable a smaller 2-D footprint of the process chamber, which may allow more chambers to be added to a single mainframe and/or decrease the size of the mainframe. The smaller travel distances enable cleaner wire management by shortening the length of electrical wires and eliminates the need for an e-chain cable management hardware used to enable the longer translation movements. Further, the disclosed system design enables the use of simpler rotational feedthrough technologies, including ferro-fluidic or rotary sliding seals to reduce the number and size of potential particles sources within the process chamber. The smaller robot footprint reduces friction surface areas within the vacuum chamber and potential particles sources (e.g., moving parts, seals, etc.) can be placed closer to the vacuum port to remove particles before they can reach the substrate.

The system may be used for processing a semiconductor substrate used to build electrical devices for any purpose or application. The system may include a processing chamber with an interior volume capable of being maintained at sub-atmospheric pressure, while treating or moving the substrate within the interior volume. In one instance, the system may be configured with a fluid nozzle designed to dispense fluid or gas during the treatment and may be disposed opposite, or above, the substrate secured to the system. The system includes a pivot component including a swing-arm with a substrate holder disposed at one end and a pivot point disposed at the opposite end. The pivot component includes a stepper motor coupled to the pivot point and rotates the swing-arm around a pivot point, in an arc-like motion, between two positions no more than 145° apart. In conjunction with the pivoting motion, the substrate holder includes a rotation system to rotate the substrate around its own center point. The system may include a swing-arm of any length which insures the pivot point is horizontally offset from the substrate center point, in that a vertical line, being perpendicular to the substrate's surface, cannot be drawn through the pivot point and the substrate center point. The pivot component may include a combination of elements inside (e.g., substrate holder or chuck, etc.) and outside (e.g., rotating/oscillating motor, etc.) the chamber to enable the substrate movement within the process chamber.

In one embodiment, the pivot component is configured to move the swing-arm back and forth around the pivot point, such that the opposite end of the swing-arm rotates the substrate in an arc-like motion between two radial positions that are less than 145° apart, as measured from the pivot point. The support component may include a support surface for a microelectronic substrate to secure the microelectronic substrate to the support component. In one specific embodiment, a substrate rotation component may be coupled to the support surface, which enables the rotating of the support surface around a center point of the support surface. In this instance, the center point is horizontally, vertically, and/or radially offset from the pivot point of the swing-arm, such that the substrate's center of rotation is different from the swing-arm's center of rotation. The substrate rotation may be enabled by a stepper motor or magnetic levitation motor disposed within the substrate support component or the swing-arm. In one specific embodiment, the swing-arm may be coupled to the rotational motor via a pivot rod (e.g., shaft, tube, etc.) that enables the swing-arm to be offset from the motor, such that the rotating motor may be disposed outside of the interior volume. In another embodiment, the pivot component may be configured to oscillate the swing arm around the pivot point between at least two positions to maximize treatment fluid coverage across the substrate based, at least in part, on the relative position of the fluid nozzle to the substrate, and/or the diameter of the substrate.

In one embodiment, a treatment method using the pivot component can include using the swing-arm rotation motor to position the swing-arm to a loading/unloading position within the process chamber. The substrate handler places the microelectronic substrate on a rotation component (e.g., support surface) coupled to the swing-arm. After the substrate is secured to the swing-arm through any mechanical or electrical means the swing-arm may be positioned to an initial starting position underneath or proximate to the nozzle disposed within the treatment chamber. In one specific embodiment, the substrate is positioned to avoid any surface area of the substrate being located directly underneath the nozzle, prior to dispensing the treatment fluid. Once in position, the substrate may begin rotating around its center point at a predetermined radial velocity. Likewise, the system controller will confirm any other predetermined recipe conditions (e.g., chamber pressure, process gas temperature, incoming gas pressure, or combination thereof) are satisfied before flowing process treatment gas through the fluid nozzle into the process chamber. In this embodiment, the system controller will instruct the pivot component to pivot the swing-arm around the pivot point in an arc-like motion, for a predetermined time and angular velocity, between two or more positions within the process chamber. In most substrate cleaning embodiments, the angle of rotation between the two or more positions will be less than 360°, and typically less than 145°.

The systems and methods disclosed herein may be applied to any semiconductor device manufacturing operation that would benefit from improved movement efficiency and smaller chamber or tool footprint. The scope of the disclosure is not limited to sub-atmospheric processing applications and the sub-atmospheric embodiments disclosed herein are merely for exemplary and illustrative purposes.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION OF SEVERAL EMBODIMENTS

Figure 1:
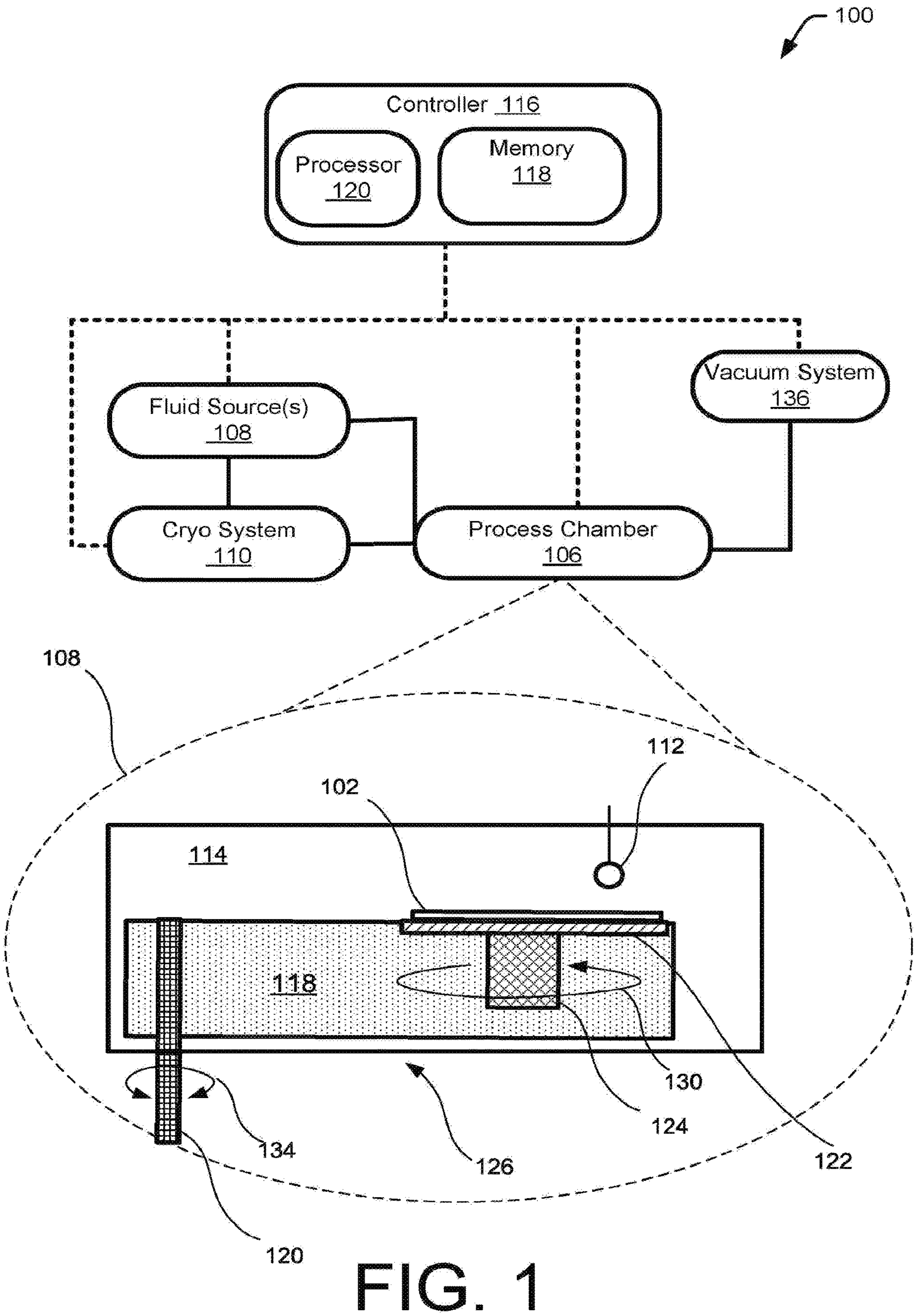
FIG. 1 includes a schematic illustration of a cleaning system and a cross-section illustration of a process chamber of the cleaning system according to at least one embodiment of the disclosure.

FIG. 1 includes a schematic illustration of an exemplary treatment system to treat microelectronic substrates by moving the substrates relative to dispense source(s) within a chamber in a unique way. Particularly, in embodiments with a single dispense source with concentrated fluid flow capable of treating discrete portions of the substrate, such that moving the substrate around improves within wafer process results. However, the handling system is not limited to single dispense source treatments and may be used with multi-source dispense treatments to enable more uniform chemical treatments (e.g., cleans, depositions, etch, etc.). For exemplary and illustrative purposes, the treatment system is described as a cryogenic cleaning system, but is not intended to limit the scope of the claims to cleaning embodiments. For example, the systems and methods disclosed herein may apply to deposition, etch, track, metrology, patterning, or any other processing techniques used to manufacture electrical devices.

Broadly, the substrate handling system disclosed herein includes a nested-rotating mechanism with two simultaneously rotating members to move the substrate within a chemical treatment environment. The mechanism includes a pivoting arm oscillating back and forth around a pivot point located at one end of the pivoting arm. Disposed at the opposite end of the pivot point is a substrate support component capable of securing and rotating the substrate around its center point. The combination of the pivoting and rotating motion enable the broadest surface exposure within a relatively small surface area. Accordingly, the smaller surface area minimizes the process chamber footprint, and volume, which can improve cycle time, chemical costs, and mainframe footprint, in addition to the process benefits.

Turning to FIG. 1, the treatment system is illustrated as a cleaning system 100 capable of cleaning particles, contaminants, or films from a microelectronic substrate 102 using a cryogenically cooled fluid. The process chamber 106 may be configured to receive pressurized fluid(s) from one or more one or more fluid sources 108 cooled by a fluid cooling system or a cryogenic cooling system 110 (e.g., liquid nitrogen) prior to being flowed or expanded through a nozzle 112 into the interior volume 114 which is maintained at a relatively low pressure by a vacuum system 136 coupled to the process chamber 106. The cryogenically cooled fluid may be directed towards the substrate 102 which is secured to a handling system 104 disposed within the process chamber 106, as illustrated in the cross-sectioned side view 108. In one embodiment, the gas lines for the cooled fluid are insulated to minimize temperature variation and prevent condensation.

In this embodiment, a single nozzle 112 is used to dispense the treatment fluid into the interior volume. In some instances, the size difference between the nozzle's outlet diameter and the substrate diameter can be very large (e.g., >50×). Accordingly, in some instances, the dispensed fluid may only be capable of cleaning a relatively small area compared to the size of the substrate 102. In the past, this issue was compensated by linearly translating and rotating the substrate 102 underneath the nozzle 102. However, treating the substrate 102 in this way requires translating the substrate over a long distance (e.g., at least 2× the diameter) to treat the entire substrate 102 and maintain a desirable PRE. The travel distance dictates an interior volume 114 of sufficient size to move the substrate without contacting the sidewalls of the process chamber 106. The travel distance and chamber volume may negatively impact treatment process cycle time, in that it takes more time to travel larger distances and pump/purge a larger volume. Accordingly, reducing travel distance and process chamber 106 volume may positively impact cycle time and make the cleaning system 100 more cost effective to operate.

Disclosed herein is a handling system 104 intended to reduce the substrate's horizontal or 2-D travel distance, which enables a reduction in the interior volume 114. The distance and volume advantages of the handling system 104 are enabled by a mechanism capable of rotating the substrate 104 back-and-forth, around a pivot point, in an arc-like motion underneath the nozzle 112, while simultaneously rotating the substrate 102 around its own center point. The nozzle 112 may be positioned to avoid passing over the substrate's center point during the treatment.

The handling system 104 implements the combination of two radial movements of the substrate 102 by using a swing-arm 118 secured to a pivot rod 120 at one end and a substrate support component 122 at the opposite end. The pivot rod 120 is rotated back-and-forth by no more than 145°, such that the distal end of the swing-arm 118 moves along an arc formed by the radius of the swing-arm 118 and the angle of rotation of the pivot rod 120. In this way, during the process treatment the substrate 102, when viewed from above or from the nozzle 112, appears to pivot around the pivot rod 120 in an arc-like motion. This pivoting motion is indicated by the pivot arrow 134 shown in FIG. 1. The pivot rod 120 is the first center of rotation of the handling system 104.

The handling system's second center of rotation is located at the center of the substrate support component 122, which configured secure the substrate 102 using mechanical and/or electrical means. The substrate support component is configured to allow the substrate 102 to rotate around its own center point. In this instance, a rotating system 124 is coupled to support component 122 and is capable of rotating the substrate 102 as indicated by the rotation arrow 130 shown in FIG. 1. The substrate's rotation velocity and the swing-arm's angular velocity, as well as other cleaning system 100 operations, can be controlled via a controller 116 capable of executing instructions stored in memory 118 and executed on a computer processor 120 to implement any treatment techniques within the process chamber 106.

A person of ordinary skill in the art of semiconductor processing may be able to configure the cleaning system 100 (e.g., fluid source(s) 108, cryogenic cooling system 110, vacuum system 136, controller, and their respective subcomponents (not shown, e.g., sensors, etc.) to implement any treatments performed in the process chamber 106.

Figure 2:
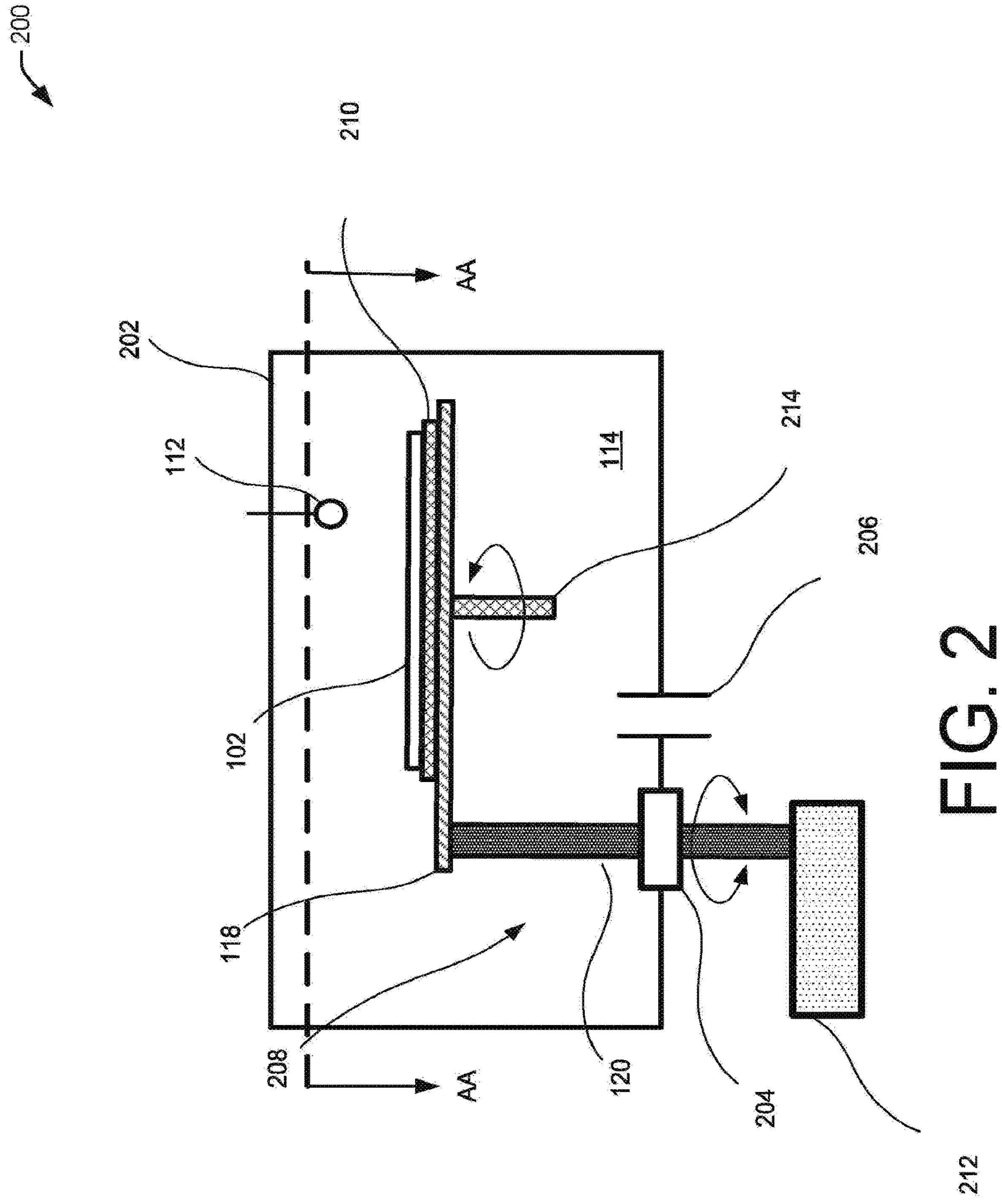
FIG. 2 includes a cross-section side-view illustration of another handling system embodiment used by the cleaning system according to at least one embodiment of the disclosure.

In the FIG. 1 embodiment, the rotating system 124 is shown to be embedded into the swing-arm 118 to minimize contamination from the moving parts of the rotating system 124. However, in other embodiments, the rotation device may be coupled to the backside of the swing-arm 118, as shown in FIG. 2, or integrated into the substrate support component 122 on the front side of the swing-arm 118. The front side of the swing-arm being opposite the nozzle and the backside of the swing-arm 118 being opposite its front side.

FIG. 2 illustrates a cross-sectional side view of an exemplary embodiment of the process chamber 106 and the handling system 104 shown in FIG. 1. The FIG. 2 embodiment shares some common aspects related to the components used to operate the cleaning system 100 of FIG. 1. For example, the operating components (e.g., controller 116, etc.) outside of the process chamber 106 are applicable to the pivoting system 200 illustrated in FIG. 2. Similarly, some internal components of the pivoting system 200 may be used or operate in a similar manner as described in FIG. 1. For example, the common internal components may include, but are not limited to, the nozzle 112 and the interior volume 114. Additionally, the substrate 102 movement capabilities described in the FIG. 1 embodiment may be implemented by the pivoting system 200 in a similar manner. Likewise, the concepts and components of the pivoting system 200 may also apply to the cleaning system 100 and/or process chamber 106 of FIG. 1.

In FIG. 2, the pivoting system includes sidewalls 202 of a process chamber 106 which enclose the interior volume 114 to help enable sub-atmospheric processing for the cleaning system 100. The sidewalls 202 enclose a portion of the pivoting system 200 within the interior volume 114 and is configured with a vacuum tight pass-through 204 to connect the interior portion with the exterior portion. The pass-through 204 may be rotary sliding seal or a ferro-fluidic seal to allow the exterior portion (e.g., motor) of the pivoting component 200 to be exposed to atmospheric conditions while enabling the interior portion to operate within a sub-atmospheric environment. The sidewalls 202 may include other additional vacuum-tight inlets and outlets to dispense chemicals into the interior volume 114 or to evacuate those chemicals during a treatment. For example, the nozzle 112 is coupled to the fluid source 108 and gas distribution network that delivers the treatment chemicals to the process chamber 106. The gas lines connected to the nozzle 112 or the nozzle 112 itself may be disposed within the sidewall 202 while enabling a vacuum tight seal to be maintained within the interior volume 114. A vacuum port 206 is disposed within the sidewall 202 is connected to the vacuum system 136 to evacuate fluid dispensed into the interior volume 114. In FIG. 2 embodiment, the vacuum port 206 is disposed underneath the substrate 102 to have a greater likelihood of removing particles generated by the pivoting system 200 before they can impact the substrate 102. Additionally, placing the vacuum port 206 below or opposite of the substrate's arc-like motion may improve fluid flow uniformity across the substrate 102 which may provide a more uniform PRE result. In one specific embodiment, the vacuum port 206 may be disposed on the lower or bottom sidewall 202 at a median point of the substrate's arc-like travel path enabled by the pivot component 208 of the pivoting system 200.

Broadly, the pivot component 208 secures the substrate 102 prior to treatment and then moves the substrate 102 back-and-forth in a radial arc-like motion underneath the nozzle 112, while simultaneously rotating the substrate 102 around its own center point. The pivot component 208 and the nozzle 112 may be positioned to accommodate the desired treatment result. For instance, in one embodiment, the nozzle 112 and pivot component 208 are positioned relative to each other that, such that the nozzle 112 passes over the substrate's center point at the median of the arc-like motion executed by the pivot component 208. However, in other embodiments, the nozzle 112 may be laterally offset from the center point of the arc-like motion, such that the nozzle 112 avoids passing over the entire diameter of the substrate 102. In this way, the substrate's horizontal travel distance, during the treatment, may be minimized and may enable a smaller interior volume 114 for the pivot component 208. However, the position of the nozzle 112 may vary depending on the desired performance of the cleaning system 100 or other applications. For example, the nozzle 112 placement, relative to the pivot component 208, may be balanced against process capability of the treatment and the cost of ownership (e.g., cycle time, chemical consumption, footprint, etc.). In some instances, the treatment application may benefit from the nozzle 112 passing over the entire substrate 102 diameter, but in other treatment applications the cost benefit of a smaller interior volume 114 and shorter horizontal or lateral travel distance may not negatively impact the treatment result.

In the FIG. 2 embodiment, the substrate 102 is secured to the pivot component 208 via a substrate support component 210 disposed on one end of a swing-arm 118 that is coupled to a pivot rod 120 at the opposite end of the swing-arm 118. The arc-like motion of the substrate 102 is driven by a rocking component 212 coupled to the distal end of the pivot rod 120 and rocks rotates the pivot rod 120 back-and-forth between at least two positions less than 145° apart. Additionally, a substrate rotation component 214, coupled to the backside of the swing-arm 118 and/or the substrate support component 210, drives the 360° substrate 102 rotation around its own center point.

The substrate support component 210 may include a chuck or support surface to secure the substrate 102 to prevent any uncontrolled movement during the treatments. The chuck may use any mechanical, electrical, and/or pneumatic means to clamp or secure the substrate 102 to the chuck. The chuck should be capable of securing the chuck during while the swing-arm 118 and substrate 102 are being rotated.

In one embodiment, the substrate rotation component 218 may be coupled to the back side of the swing-arm 118 and/or the substrate support component 210. The rotation component 218 may include a stepper motor with a rotating drive shaft the rotation of the chuck or support surface using a rotary bearing mechanism, such that the substrate chuck or support surface can rotate around its own center point. The stepper motor is electrically coupled to the controller 116 which can modulate the rotation speed, as needed.

In another embodiment, the rotation component 218 may include a magnetic levitation system (not shown) that can be magnetically coupled to the substrate chuck or surface support. The levitation system may include a magnetic radial bearing to magnetically control substrate chuck movement in the horizontal, vertical, and radial directions. For example, each movement direction is independently controlled by a corresponding groups of magnets to lift, stabilize, and rotate the substrate chuck. Each group is designated for controlling a specific movement direction and are coordinated, via the controller 116, to rotate the substrate chuck without making physical contact with any other component of the pivoting system 200.

In another embodiment, the substrate chuck or support surface may include a heating element (not shown) to heat the substrate 102 during the cryogenically cooled treatment. The heating may be used to prevent substrate 102 warpage caused by the cooled treatment fluids which may enable a temperature gradient within the substrate 102. In some instances, the temperature gradient is large enough to induce enough stress to cause deformation of the substrate 102. In some embodiments, heating the substrate 102 may improve treatment performance, such as removing particles during a cleaning treatment, preventing reattachment of particles, removing material during an etching treatment, or depositing material during a deposition treatment. In one embodiment, the heating element may include a resistive element coupled to the swing-arm 118 and positioned proximate to rotating portion of the substrate chuck, but not in physical contact with any rotating portion of the substrate chuck.

As shown in FIG. 2, the substrate support component 210 is coupled to one end of the swing-arm 118 with the pivot rod 120 coupled to the opposite end. The swing-arm 118 and pivot rod 120 form a simple mechanism driven by the rocking component 212 to move the substrate 102 through a predetermined motion within the interior volume 114. The connection of the swing-arm 118 and the pivot rod 120 form the pivot point the substrate 102 is rotated around between two locations within the interior volume 114. In this embodiment, the two locations are selected to allow the nozzle 112 to pass over the substrate 102 without passing over the substrate's center point. Accordingly, the swing-arm's length is dependent upon the diameter of the substrate 102 and the position of the nozzle 112 within the interior volume 114. Generally, the swing-arm 118 arm radius should be greater than or less than the horizontal distance between the pivot point and the nozzle 112 to prevent the nozzle 112 from passing over the substrate's center point during the treatment. The length of the pivot rod 120 is dependent the position of the rocking component 212 and any desired clearance between the nozzle 112 and the substrate 102.

In one embodiment, the swing-arm 118 and the pivot rod 120 are formed with interior volumes to allow electrical or pneumatic lines to reach the substrate chuck. The electrical and pneumatic lines may be used to control the rotation and clamping of the substrate 102 of the substrate chuck. The swing-arm 118 and the pivot rod 120 can be made of any suitable material with the strength and composition to withstand any of the forces applied to them, suitably resist any chemical reaction with the treatment fluids introduced into the interior volume 114, and prevent treatment fluid from reaching their interior volumes.

Figure 3:
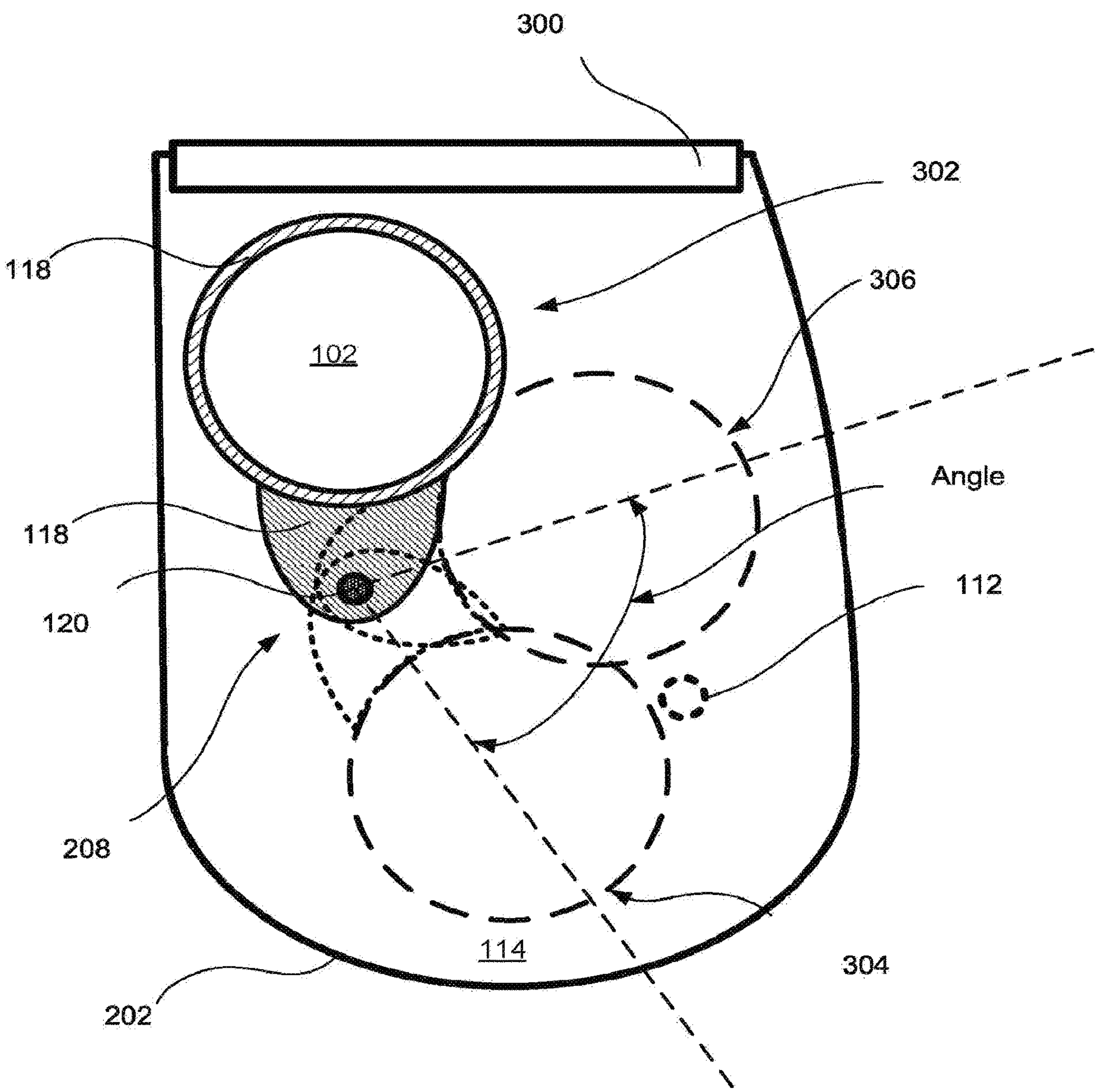
FIG. 3 includes a top-view illustration of the handling system according to at least one embodiment of the disclosure.

The rocking component 212 may be any suitable electrical/mechanical device that can reliably rotate the pivot rod 120 in a back-and-forth motion less than 145° apart. For example, a stepper motor with suitable torque and response to allow the substrate 102 to be moved at an angular velocity of up to 50°/s along the arc-like path of the free end of the swing-arm 118. FIG. 3 illustrates a top view of the pivoting system as seen from the cross-section line AA-AA during various stages of the treatment process.

FIG. 3 is an exemplary embodiment of the pivoting system 200 illustrating the top view of pivot component 208, as seen from line AA-AA in FIG. 2, in various positions during a treatment in the interior volume 114. In FIG. 3, the pivot component 208 is illustrated as the swing-arm 118, pivot rod 120, and the substrate support component 210 with a substrate 102. The pivot component 208 is disposed within the process chamber 106 represented by the sidewalls 202 and a transfer door 300, not visible in FIG. 2, that is an opening used to move the substrate 102 in and out of the process chamber 106. The transfer door 300 uses an electrical/mechanical/pneumatic actuator to open and close the transfer door 300 to create an opening in the sidewall 202 that allows the substrate 102 to be moved in or out of the process chamber 106. A transfer mechanism (not shown) will pick-&-place the substrate 102 on and off of the substrate support component 210, when the pivot component 208 is in the loading position 302. Generally, the loading position 302 is proximate to the transfer door to minimize travel distance of the transfer mechanism into the interior volume, but the process chamber 106 does not require a designated loading position 302 to be separate from the processing positions and is merely shown this way for ease of illustration an explanation of possible positions within the process chamber 106.

In one embodiment, the pivot component 208 may be moved from the loading position 302 to a first position (e.g., starting position) 304 prior to beginning the treatment. In this instance, the nozzle 112 is positioned just off the edge of the substrate 102 before treatment fluid is dispensed within the interior volume 114. The substrate support component 210 may start rotating the substrate 102 before the treatment fluid is dispensed from the nozzle 112. Once the flow of treatment fluid and process pressure has stabilized, the pivot component 208 will rotate the swing-arm 118 to a second position 306 that brings a portion of the substrate 102 directly underneath the nozzle 112. The pivot component 208 will pivot back-and-forth between the first position 304 and the second position 306 throughout the treatment for desired amount predetermined time and may stop at the first position 304 or the second position 306. The substrate 102 will move in an arc-like motion 308 around the pivot point (e.g., pivot rod 120) throughout the treatment. After the fluid dispensing ends, the substrate 102 will stop rotating and the swing-arm 118 will move to the loading position 302 to make the substrate 102 available for pick-up by the transfer mechanism.

Figure 4:
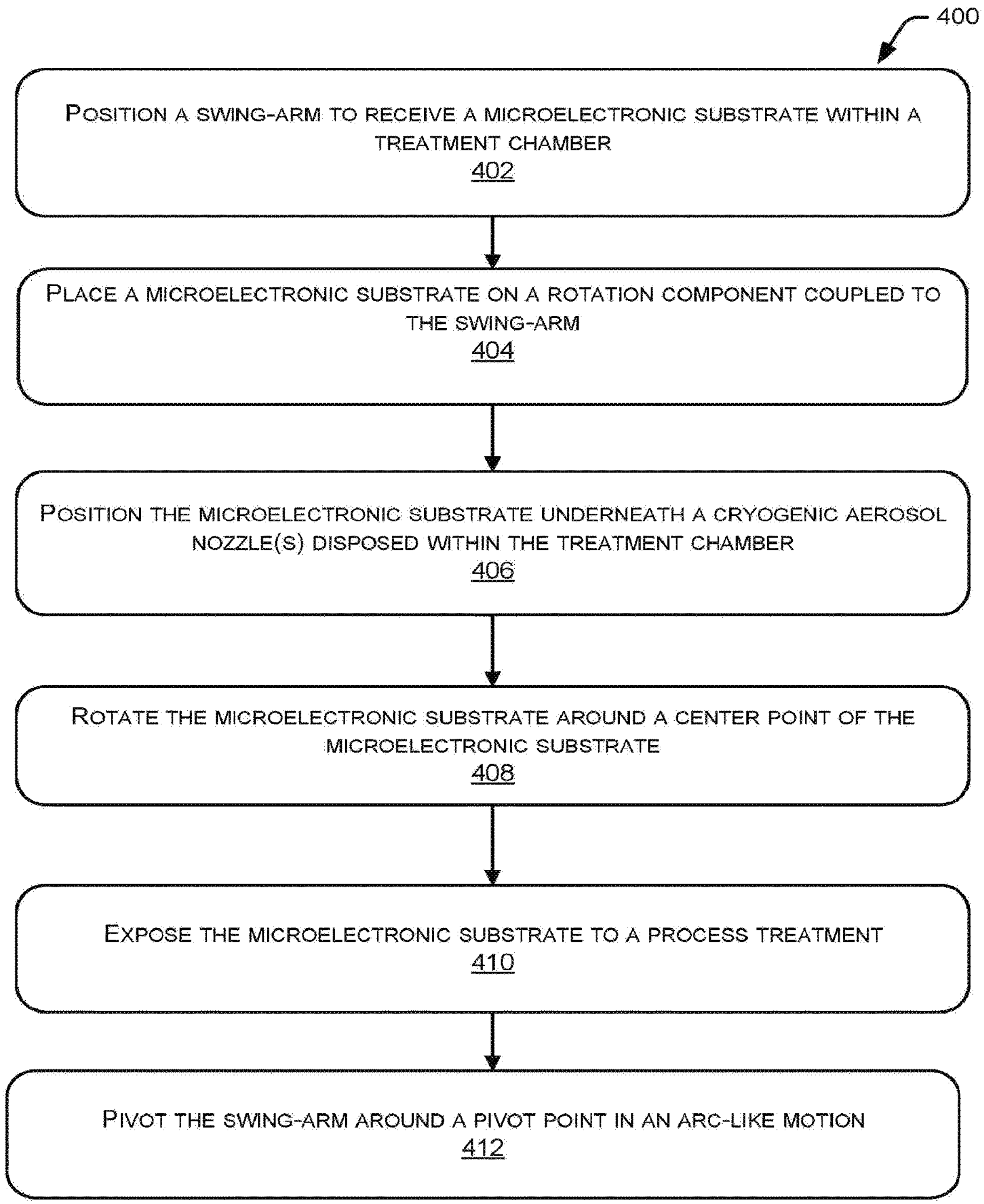
FIG. 4 includes a flow chart of an exemplary method using the cleaning system according to at least one embodiment of the disclosure.

FIG. 4 includes a flow diagram 400 for a method for treating a substrate using the pivoting system 200. The method disclosed herein may be implemented on the pivot component 208 using a controller 116 executing computer-processor executable instructions being stored in non-transitory media (e.g., memory) which direct substrate 102 movement and cleaning system 100 components to implement treatment conditions on the substrate 102. The sequence of the method steps is exemplary and the steps may be done in variety sequences, unless otherwise indicated.

At block 402, the pivot component 208 will position the swing-arm 118 into a loading position 302 to receive the microelectronic substrate within the process chamber 106 (e.g., treatment chamber). The transfer robot will move the substrate 102 through the transfer door.

At block 404, the transfer robot will place the microelectronic substrate 102 on a rotation component (e.g., substrate support component 210) that is coupled to the swing-arm 118. The rotation component will secure the microelectronic substrate 102 to the pivot component 208 using any electrical, mechanical, and/or pneumatic means.

At block 406, the pivot component 208 positions the microelectronic substrate 102 underneath or opposite the cryogenic nozzle(s) disposed within the treatment chamber. For example, the substrate 102 may be placed in the first position 304 or the second position 306 in preparation for the treatment.

At block 408, the pivot component starts to rotate the microelectronic substrate 102 around a center point of the microelectronic substrate 102. The substrate support component 210 may rotate the substrate at rotation velocity between 10 rpm and 300 rpm depending on the treatment requirements. The controller 116 may include a pivoting velocity component that may include hardware, firmware, software, or combination thereof to adjust the angular velocity to vary the nozzle 112 dwell time across the substrate 102. For example, the controller 116 may be execute instructions to vary the angular velocity based, at least in part, on a relative location of the fluid nozzle 112 to a center point of the microelectronic substrate 102. For example, the angular velocity of the swing-arm 118 may be faster when the fluid nozzle 112 is within a certain distance from the center point, and will slow down when the fluid nozzle 112 is further away from the center point. In another embodiment, the angular velocity will increase or decrease as a function of nozzle 112 position relative to the substrate's center point or the edge of the substrate 102. The dwell time of the nozzle 112 over particular location may vary based on the speed of the substrate 102. As the nozzle 102 moves away from the substrate's center, the substrate 102 velocity will increase causing a corresponding dwell time decrease. This means the treatment is unevenly distributed over the substrate 102, since regions closer to the center will have a higher Dwell time than regions closer to the substrate's edge. This variation will produce non-uniform treatment results, such that some areas are over-cleaned or under-cleaned depending on the relative position to the center of the substrate 102. Hence, as the nozzle 112 moves or becomes closer to the substrate's center, the angular velocity may increase to stabilize the dwell time, the amount of time over a location, across the substrate 102. For example, the angular velocity may transition between 50 rpm and 120 rpm in a non-linear manner when the substrate transitions between the first position 304 and the second position 306. In other embodiments, the angular velocity may be based, at least in part, on the relative position of the nozzle 112 and the rotation velocity of the support component 210 as it transitions between the first position 304 and the second position 306.

At block 410, in one embodiment, the controller 116 may direct the cleaning system 100 to flow the treatment chemicals into the interior volume and expose the microelectronic substrate 102 to the treatment chemicals. In this instance, the chemical exposure may be started before the nozzle 112 outlet is directly above the substrate 102, such that the initial is fluid is directed towards the opposite sidewall 202, and not the substrate 102. However, in this embodiment, the substrate 102 is considered exposed to the treatment chemical when it is dispensed into the interior volume 114.

In one specific embodiment, the treatment may include a nitrogen, argon, or a combination of both being dispensed from the nozzle 112 at a temperature between 70K and 270K and at a pressure that prevents liquid from forming in the treatment fluid. A the person of ordinary skill in the art may be able to select the proper combination of temperature and pressure using phase diagrams or any other known phase diagram literature that may be available for a single species or a mixture of species. The process chamber 106 pressure may be maintained at less than 100 Torr in many embodiments.

At block 412, the pivot component 208 may begin pivoting the swing-arm 118 back-and-forth around the pivot point (e.g., pivot rod 120) after the controller 116 has confirmed the process conditions (e.g., pressure, flow, substrate rotation) are within desired limits. In most instances, the swing-arm's angle of rotation, as measured from the pivot point, will less than 360° to achieve the cost advantages of having a smaller interior volume 114 than previous techniques. In most embodiments, the controller 116 will limit the angle of rotation between the first position 304 and the second position 306 will be less than 145°. Based on the angle of rotation limitation, the substrate's center point will travel along an arc-line around the pivot point. Additionally, the controller 116 may limit the swing-arm's angular velocity between 5 and 50 arc degrees per second as the swing-arm 118 oscillates between the first position 304 and the second position 306.

In some embodiments, the controller 116 may be execute instructions to vary the rotation velocity based, at least in part, on a relative location of the fluid nozzle 112 to a center point of the microelectronic substrate 102. For example, the rotation velocity may be faster when the fluid nozzle 112 is within a certain distance from the center point, and will slow down when the fluid nozzle 112 is further away from the center point. In another embodiment, the rotation velocity will increase or decrease as a function of nozzle 112 position relative to the substrate's center point or the edge of the substrate 102. The dwell time of the nozzle 112 over particular location may vary based on the speed of the substrate 102. As the nozzle 102 moves away from the substrate's center, the substrate 102 velocity will increase causing a corresponding dwell time decrease. This means the treatment is unevenly distributed over the substrate 102, since regions closer to the center will have a higher Dwell time than regions closer to the substrate's edge. This variation will produce non-uniform treatment results, such that some areas are over-cleaned or under-cleaned depending on the relative position to the center of the substrate 102. Hence, as the nozzle 112 moves or becomes closer to the substrate's center, the rotation velocity may increase to stabilize the dwell time, the amount of time over a location, across the substrate 102 to control treatment uniformity across the entire substrate 102. For example, the rotation velocity may transition between 50 rpm and 120 rpm in a non-linear manner when the substrate transitions between the first position 304 and the second position 306. In other embodiments, the rotation velocity may be based, at least in part, on the relative position of the nozzle 112 and the angular velocity of the swing-arm 118 as it transitions between the first position 304 and the second position 306.

The controller 116 may control the swing-arm's angular velocity and substrate 102 rotation velocity for a predetermined amount of time stored in memory 118. At the conclusion of the chemical treatment, the controller will stop rotating the swing-arm 118 and the substrate 102 and then direct the swing-arm 118 to return to the loading position 302 to enable the transfer robot to pick up the substrate 102 and remove the substrate from the process chamber 106.

Figure 5:
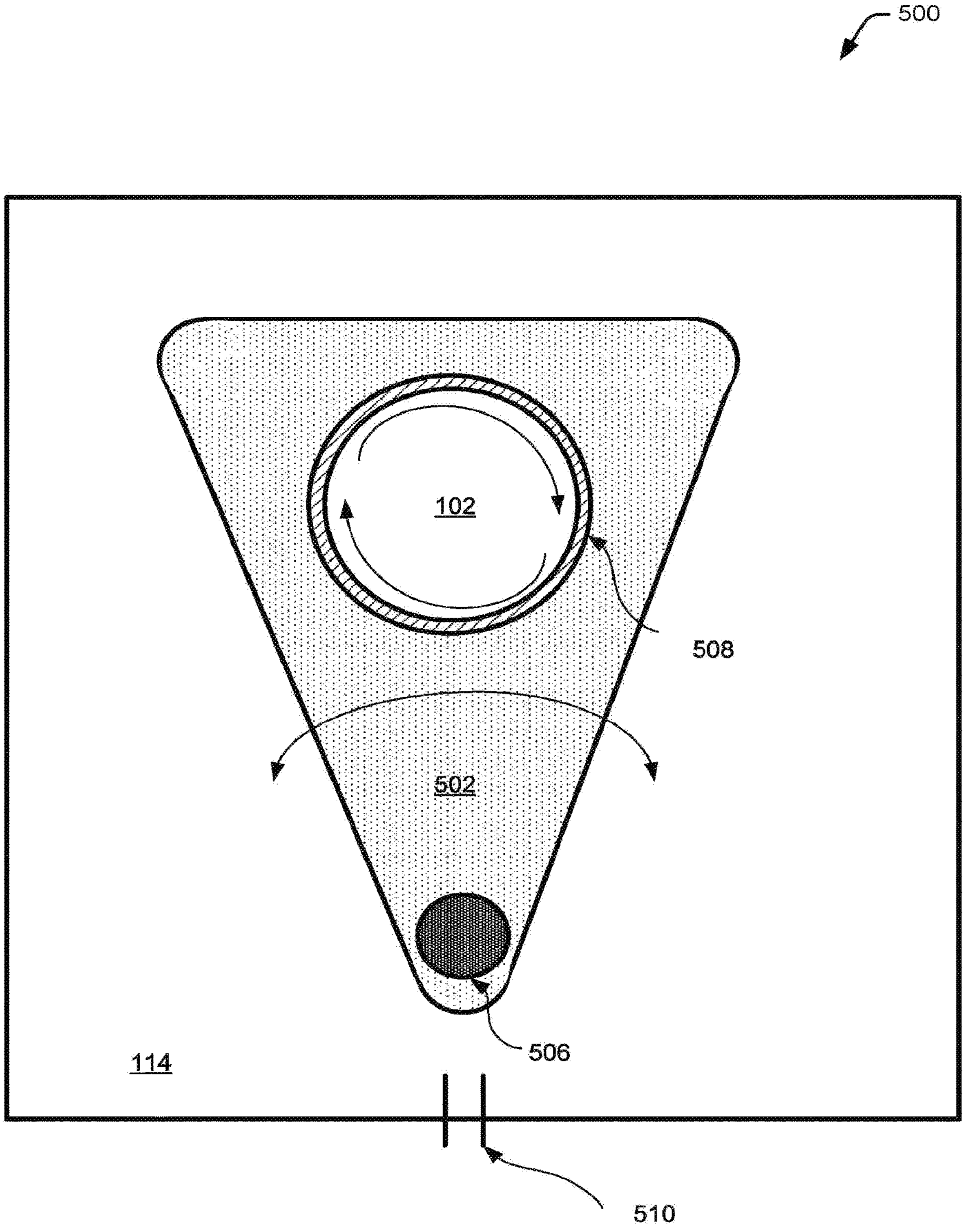
FIG. 5 includes a top-view illustration of another handling system embodiment according to at least one embodiments of the disclosure.

FIG. 5 includes a top-view illustration of a treatment system 500 and is another embodiment of the handling system 104 and process chamber 106. In the FIG. 5 embodiment, the handling system 104 may include a pivot arm 502 or a swing-arm stage which pivots around a fixed point 504 (e.g., pivot point). The pivot point may be located at one end of the pivot arm 504 and may be secured to a mechanism that moves the pivot arm 504 between a first and second position within the treatment system 500. The pivot arm 502 movement may oscillate between the first and second position, such that the pivot arm 502 rotates less than 360 degrees around the pivot point 506. In one specific embodiment, the pivot angle between the first and second position will be on an arc of less than or equal to 145 degrees. In some instances, the nozzle 112 placement may limit the fluid coverage of the microelectronic substrate 102, which may be enhanced by adding a rotational-stage 508 at the distal end of the pivot arm 502, which is opposite the pivot point. In this embodiment, the pivot arm may translate between the first position and the second position while the microelectronic substrate 102 is being rotated underneath the nozzle 112 that is used to form a cryogenic aerosol or GCJ spray, or other treatment chemistry. In this way, the translation and rotation of exposes different portions of the microelectronic substrate 102 and increases surface area coverage for the cryogenic aerosol or GCJ spray, while minimizing the size of chamber used for the cleaning treatment.

In one embodiment, the rotation mechanism 508 may be incorporated into the pivot arm 502 or coupled to the pivot arm to enable 360-degree rotation of the microelectronic substrate 102 during treatment while the pivot arm 502 is being moved between the first and second position. The rotation mechanism 508 may include a surface support area to secure the microelectronic substrate during treatment. The surface support area may also include a heating element to counter-act the surface cooling caused by the cryogenic aerosol or GCJ spray to enhance the cleaning process, prevent redeposition of removed particles back onto the cleaned surface and also to prevent condensation within the process chamber (e.g., the microelectronic substrate 102 or the nozzle 112).

In another embodiment, the pivot arm 502 movement may be driven by a stepper motor, as shown in FIG. 1 that oscillates back and forth to sweep the microelectronic substrate 102 in an arc-like motion around the pivot point. The stepper motor may be located outside of the process chamber and is belt-coupled to a hollow shaft that extends into the process chamber 106. The hollow shaft marks the pivot point 506 for the pivot arm 502 which is coupled to the hollow shaft. The hollow shaft is coupled to a ferrofluidic sealed rotational feedthrough device that has mechanical bearings on the atmospheric pressure side of the ferrofluidic seal to support the shaft vertically. The ferrofluidic feedthrough assembly is then bolted and sealed to the bottom of the chamber with a flange and O-ring. The hollow may be used to run wires from outside the process chamber to the rotation mechanism 508 disposed on the pivot arm 502. The wires will be shielded from the process gases by the hollow shaft and the pivot arm 502.

As shown in the FIG. 1 embodiment, the pivot arm 502 may extend past the diameter of the microelectronic substrate 102 to allow the pivot point 506 to be placed away from the microelectronic substrate surface to minimize contamination caused by friction of pivot arm 502 pivoting between the first and second position.

One objective of the arc-motion system is to enable the cryogenic aerosol or GCJ spray to cover or treat as much, if not all, of the surface area of microelectronic substrate where microelectronic devices are built. The cryogenic aerosol or GCJ spray expands into the process chamber going from high pressure to a low pressure environment. Accordingly, the cryogenic aerosol or GCJ spray expands or covers a broad area (e.g., 100 mm-150 mm) compared to the nozzle diameter (e.g., <5 mm) which means the nozzle does not have to dwell directly above the entire surface area to efficiently treat the microelectronic substrate. For example, the position of the nozzle 112 and arc-system motion may be optimized to minimize translation or the arcing movement and enable surface coverage of the cryogenic aerosol or GCJ treatment across the entire surface of the microelectronic substrate 102. In one embodiment, the nozzle 112 may be held at a fixed location, but the nozzle is not required to be stationary, while the microelectronic substrate is translated in an arc-like movement underneath the nozzle. The microelectronic substrate 102 may also be rotating around center point of the substrate in conjunction with the arc-like movement. The arc-like movement and the rotation speeds may be optimized to provide a dwell time based, at least in part, on particle removing efficiency of the cryogenic aerosol or GCJ spray. The dwell time may vary based on the surface conditions (e.g., film type, film pattern, particle size, etc.) of the microelectronic substrate. Broadly, the angular velocity of the pivot arm will vary between 5 and 50 arc degrees per second and the rotation velocity of the substrate support may range between 10 and 300 RPM. As noted above, the arc-like movement may sweep up to 145 degrees around the pivot point.

In one specific embodiment, the cryogenic aerosol or GCJ spray treatment may start with the nozzle a few degrees off of the edge of the microelectronic substrate. The arc-like movement of the microelectronic substrate 102 may start by positioning the nozzle above the microelectronic substrate at a radius, relative to the center of the microelectronic substrate, which is smaller than the diameter than the microelectronic substrate (e.g., 115 mm from the center of a 300 mm diameter microelectronic substrate). The cryogenic aerosol or GCJ spray may turned on by allowing the process chemicals to flow through the nozzle towards the microelectronic substrate. In some instances, the cryogenic aerosol or GCJ spray may be allowed to stabilize at this radius before starting the arc-like movement around the pivot point. In some embodiments, the microelectronic substrate may start rotating around its center point before or after the start of the arc-like movement.

During the process treatment, the microelectronic substrate 102 may be moved through one or more movement profiles designed to maximize process treatment coverage over the microelectronic substrate. The movement profiles may vary the location, speed, and dwell time of the microelectronic substrate relative to the nozzle(s) 112.

In one embodiment, the movement profile may include the nozzle 112 passing over the microelectronic substrate 102 and may stop short of the middle of the microelectronic substrate that may also be rotating around its center point to increase the surface area coverage of the cryogenic aerosol dispensed from the nozzle. Alternatively, the microelectronic substrate 102 may stop at the middle and pivot back to the starting position to treat the microelectronic substrate 102 a second time. However, this method does not require the microelectronic substrate 102 to return exactly to its starting position. For example, the nozzle may go past the middle and stop at a radius closer to the opposite side of the microelectronic substrate than the starting position. Further, the cleaning process may be improved by stopping at a radius closer to the opposite side of the microelectronic substrate and going back in the opposite direction in an arc-like movement around the pivot point 506. Any of these movement profiles may be used to clean the entire surface of the microelectronic substrate 102, depending on the effective size of the cleaning area from the nozzle.

When the nozzle 112 is near the edge of the substrate 102 and the substrate 102 is rotating, the perimeter of the circle of effective cleaning is large, so to achieve the same effective dwell time under the cleaning spray the spray the nozzle must be located over this area longer than when the nozzle is nearer the center of the substrate 102, where the perimeter of the circle of effective cleaning is shorter. Accordingly, the angular velocity of the pivot arm 502 may be varied to account for this issue. In one specific embodiment, the angular velocity of the pivot arm may be optimized to move the microelectronic substrate faster when the nozzle is closer to the center microelectronic substrate 102 to provide a substantially even exposure time to the cryogenic aerosol or GCJ spray. Also, since a cryogenic aerosol is very cold, this variable angular velocity works to prevent overly large temperature gradients across the microelectronic substrate 102 which can cause warpage of the substrate and process performance problems.

As shown in FIG. 5, the pivot point 506 may be proximate to the vacuum exhaust port 510 to minimize the probability of particles generated by the pivoting arm to reach the microelectronic substrate 102. The proximity of the pivot point 506 to the vacuum exhaust port 510 may reduce the contamination by drawing the particles to the vacuum port using the gas that is injected into the chamber upstream from the pivot point. Ideally, the gas flow would prevent particles generated from the pivoting movement from reaching the microelectronic substrate 102.

The pivoting movement of the pivot arm 502 is illustrated by the double-sided arrow showing one embodiment of the movement between the first and second positions discussed above. The pivot arm 502 is shown to be a triangular shape for the purpose of explanation and not limitation. The triangular shape is intended to highlight the pivoting or rocking motion around the pivot point. The pivot arm 502 design may vary based, at least in part, on the gas flow, vacuum port location, and/or process conditions which enable optimum particle removal efficiency during the treatment. The pivot arm 502 design may include, but is not limited to, square, rectangular, or circular designs. In the FIG. 5 embodiment, the substrate support component may be incorporated into the pivot arm. The substrate support component may secure the microelectronic substrate during treatment while the pivot arm is moving and while the substrate support component rotates microelectronic substrate at the same time. In this way, the surface area of microelectronic substrate being exposed to the nozzle is maximized during the treatment. Accordingly, the length of the pivot arm and the location of the first and second positions of the pivot arm may be optimized to enable surface area coverage of the cleaning treatment chemistry to maximize particle removal efficiency.

Figure 6:
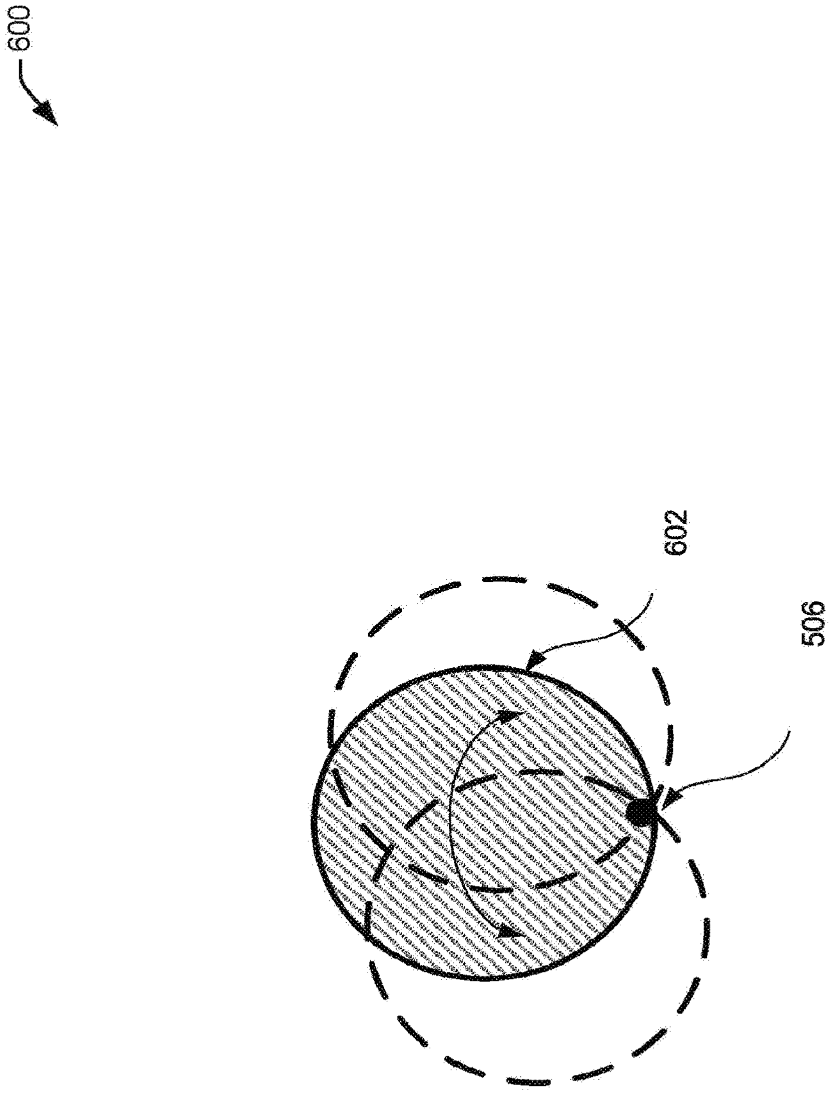
FIG. 6 includes a top-view illustration of a swing-arm movement within the handling system according to at least one embodiments of the disclosure.

FIG. 6 includes a top-view illustration of a movement diagram 600 of a support arm 602 that is representative of swing-arm 118 and pivot arm 502 movement within their respective treatment systems. FIG. 6 illustrates one example of how the embodiments disclosed herein may pivot between the first and second position within the chamber during cleaning treatments. In other embodiments, the design of the pivot arm may be used to reduce the exposed surface area of the movable chuck, such that the impact of the pivot arm on fluid flow within the chamber is minimized. For example, the vacuum port may be placed underneath the movable chuck to prevent particles from moving from the backside of the moveable chuck to the microelectronic substrate. For example, in one specific embodiment, the pivot point may be disposed underneath the microelectronic substrate depending on the surface coverage enabled by the fluid flow and the available pivot point locations (e.g., first and second positions) in view of the size of the microelectronic substrate and the chamber.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention. For example, the embodiments described above may be incorporated together and may add or omit portions of the embodiments as desired. Hence, the number of embodiments may not be limited to only the specific embodiments described herein, such that a person of ordinary skill may craft additional embodiments using the teachings described herein.

What is claimed is:

1. A method, comprising:

positioning a swing-arm to receive a microelectronic substrate within a treatment chamber;

placing a microelectronic substrate on a rotation component coupled to the swing-arm;

positioning the microelectronic substrate underneath a nozzle(s) disposed within the treatment chamber;

exposing the microelectronic substrate to a process treatment comprising a cryogenically cooled fluid;

rotating the microelectronic substrate around a center point of the microelectronic substrate; and pivoting the swing-arm back-and-forth around a pivot point.

2. The method of claim 1, wherein the pivoting comprises rotating the swing-arm at an angular velocity that varies based, at least in part, on a relative location of the fluid nozzle to a center point of the microelectronic substrate.

3. The method of claim 1, wherein the pivoting comprises rotating the swing-aim at an angular velocity between 5 and 50 arc degrees per second.

4. The method of claim 1, wherein rotating comprises rotating the microelectronic substrate at rotation velocity that varies based, at least in part, on a relative location of the fluid nozzle to a center point of the microelectronic substrate.

5. The method of claim 1, wherein the rotating comprises a rotation velocity between 10 RPM and 300 RPM.

6. The method of claim 1, wherein the pivoting comprises rotating the swing-arm between a first position and a second position, wherein the first position and second position are less than 145 degrees apart along an arc-line around the pivot point.

* * * * *

UNITED STATES PATENT AND TRADEMARK OFFICE

CERTIFICATE OF CORRECTION

PATENT NO. : 11,458,512 B2
APPLICATION NO. : 17/070223
DATED : October 4, 2022
INVENTOR(S) : Jeffery W. Butterbaugh It is certified that error appears in the above-identified patent and that said Letters Patent is hereby corrected as shown below:

In the Claims

Claim 3, Line 16, of Column 16: "rotating the swing-aim" should be --rotating the swing-arm--

Signed and Sealed this
Twenty-ninth Day of November, 2022

Katherine Kelly Vidal

Katherine Kelly Vidal
*Director of the United States Patent and Trademark Office*